(12) United States Patent  (10) Patent No.: US 7,081,771 B2
Agrawal et al.  (45) Date of Patent: Jul. 25, 2006

(54) UPGRADEABLE AND RECONFIGURABLE PROGRAMMABLE LOGIC DEVICE

(75) Inventors: Om P. Agrawal, Los Altos, CA (US);
Howard Tang, Cupertino, CA (US);
Jack Wong, Fremont, CA (US)

(73) Assignee: Lattice Semiconductor Corporation, Hillsboro, OR (US)

( * ) Notice: Subject to any disclaimer, the term of this patent is extended or adjusted under 35 U.S.C. 154(b) by 135 days.

(21) Appl. No.: 10/783,886

(22) Filed: Feb. 20, 2004

(65) Prior Publication Data

US 2005/0189962 A1  Sep. 1, 2005

(51) Int. Cl.
*H03K 19/177* (2006.01)
(52) U.S. Cl. .......................... 326/38; 326/41
(58) Field of Classification Search ............ 326/38–41; 713/1, 2, 100
See application file for complete search history.

(56) References Cited

U.S. PATENT DOCUMENTS

| | | | |
|---|---|---|---|
| 5,548,228 A | 8/1996 | Madurawe | |
| 5,640,107 A | 6/1997 | Kruse | |
| 5,689,516 A * | 11/1997 | Mack et al. | ................. 714/725 |
| 5,696,455 A | 12/1997 | Madurawe | |
| 6,049,222 A | 4/2000 | Lawman | |
| 6,150,837 A * | 11/2000 | Beal et al. | ..................... 326/39 |
| 6,467,009 B1 * | 10/2002 | Winegarden et al. | ........ 710/305 |
| 6,538,468 B1 * | 3/2003 | Moore | ........................... 326/40 |
| 6,704,850 B1 * | 3/2004 | Reynolds | ..................... 711/170 |
| 6,721,840 B1 * | 4/2004 | Allegrucci | ................... 710/306 |
| 6,732,263 B1 * | 5/2004 | May et al. | ...................... 713/1 |
| 6,774,668 B1 * | 8/2004 | Wirtz, II | ....................... 326/37 |
| 6,828,823 B1 * | 12/2004 | Tsui et al. | ..................... 326/40 |
| 6,851,047 B1 * | 2/2005 | Fox et al. | ....................... 713/1 |
| 6,873,177 B1 * | 3/2005 | Wennekamp et al. | .......... 326/8 |

OTHER PUBLICATIONS

Actel Corporation, "ProASIC$^{PLUS}$ Flash Family FPGAs", v3.4 Dec. 2003, pp. i through iv and 1-1 through 1-64 & 2-1 through 2-67 & 2-1 through 2-7 (list of changes).
Lattice Semiconductor Corporation, "ispXPGA™ Family", Preliminary Data Sheet, Sep. 2003, pp. 1-112.
U.S. Appl. No. 10/439,602, filed on May 16, 2003, entitled "Non-Volatile And Reconfigurable Programmable Logic Devices".
Lattice Semiconductor Corporation, ispXPGA™ Family, Dec. 2002, pp. 1-90.

* cited by examiner

*Primary Examiner*—Don Le

(57) ABSTRACT

Programmable logic devices and techniques for programming and/or reconfiguring these devices are disclosed. For example, in accordance with an embodiment of the present invention, a programmable logic device is disclosed that incorporates flash memory and SRAM and includes multiple data ports for programming the flash memory and/or the SRAM.

35 Claims, 3 Drawing Sheets

UPGRADEABLE AND RECONFIGURABLE PROGRAMMABLE LOGIC DEVICE

TECHNICAL FIELD

The present invention relates generally to electrical circuits and, more particularly, to programmable logic devices.

BACKGROUND

Programmable logic devices (PLDs), such as for example complex programmable logic devices (CPLDs) and field programmable gate arrays (FPGAs), utilize various types of memory to store their configuration data, which defines the functionality of the PLD. For example, CPLDs generally employ electrically erasable complementary metal oxide semiconductor (EECMOS) technology, which is non-volatile but can be programmed (e.g., receive and store data) only a limited number of times and takes longer to program than some other types of memory (e.g., static random access memory (SRAM)). CPLDs typically provide numerous benefits, such as fast, predictable timing and single-level, wide-logic support.

As another example, FPGAs typically provide benefits, such as high logic density and low standby power and generally utilize SRAM technology. SRAM is infinitely reconfigurable, but loses its programming upon power loss (i.e., volatile memory) and generally requires an external non-volatile source to supply it with configuration data upon power-up.

Various types of non-volatile technology have been introduced for FPGAs to replace SRAM. For example, antifuse-based technology provides non-volatility, but can not be reprogrammed and so is not reconfigurable. Other types of non-volatile technology have been introduced, but typically suffer from various drawbacks, such as limited programmability.

Furthermore, conventional PLDs generally provide a limited number of ways to program internal memory. For example, a PLD employing EECMOS technology (e.g., electrically erasable programmable read only memory or EEPROM) may be programmable only through a JTAG interface. As a result, there is a need for improved programmable logic devices and techniques for programming the programmable logic devices.

SUMMARY

Systems and methods are disclosed herein to provide programmable logic devices along with techniques for programming or reconfiguring these devices. For example, in accordance with an embodiment of the present invention, a programmable logic device is disclosed that incorporates flash memory and SRAM to provide certain benefits, such as in-system programmability, dynamic reconfigurability, remote upgradeability, and/or essentially instant-on capability. The flash memory eliminates the need for external configuration devices that are typically required for SRAM-based PLDs. The SRAM technology provides infinite reconfigurability, which may not be available with flash-based PLDs. Furthermore, flexible programming or configuration techniques are provided to supply configuration data from the flash memory to the SRAM or via multiple data ports (e.g., a CPU interface port and a JTAG interface port) to the flash memory and/or to the SRAM.

More specifically, in accordance with one embodiment of the present invention, a programmable logic device includes volatile memory adapted to configure the programmable logic device for its intended function based on configuration data stored by the volatile memory; non-volatile memory adapted to store data which is transferable to the volatile memory to configure the programmable logic device; a first data port adapted to receive external data for transfer into either the volatile memory or the non-volatile memory; and a second data port adapted to receive external data for transfer into either the volatile memory or the non-volatile memory.

In accordance with another embodiment of the present invention, a programmable device includes static random access memory adapted to configure the programmable device for its intended function based on configuration data stored by the static random access memory; flash memory adapted to store data which is transferable to the static random access memory to configure the programmable device; a JTAG port adapted to receive external data for transfer into either the static random access memory or the flash memory; a CPU port adapted to receive external data for transfer into either the static random access memory or the flash memory; and means for transferring the external data received by the JTAG port or the CPU port to the static random access memory or the flash memory.

In accordance with another embodiment of the present invention, a method of providing programming options for a programmable device includes providing a background mode for transferring external data via a first data port or a second data port to non-volatile memory; providing a direct mode for transferring the external data via the second data port to the non-volatile memory; and providing a system configuration mode for transferring the external data via the second data port to volatile memory, wherein the volatile memory is adapted to configure the programmable device.

In accordance with another embodiment of the present invention, a programmable logic device includes volatile memory adapted to configure the programmable logic device for its intended function based on configuration data stored by the volatile memory; non-volatile memory adapted to store data which is transferable to the volatile memory to configure the programmable logic device; and a CPU port adapted to receive external data for transfer into either the volatile memory or the non-volatile memory.

In accordance with another embodiment of the present invention, a method of providing data transfer options for a programmable logic device includes providing a CPU port adapted to receive external data for transfer into either volatile memory or non-volatile memory of the programmable logic device, wherein data stored in the volatile memory configures the programmable logic device; and providing data registers adapted to transfer data stored in the non-volatile memory to the volatile memory and to transfer data stored in the volatile memory to the non-volatile memory.

The scope of the invention is defined by the claims, which are incorporated into this section by reference. A more complete understanding of embodiments of the present invention will be afforded to those skilled in the art, as well as a realization of additional advantages thereof, by a consideration of the following detailed description of one or more embodiments. Reference will be made to the appended sheets of drawings that will first be described briefly.

BRIEF DESCRIPTION OF THE DRAWINGS

Embodiments of the present invention and their advantages are best understood by referring to the detailed description that follows. It should be appreciated that like reference numerals are used to identify like elements illustrated in one or more of the figures.

DETAILED DESCRIPTION

Figure 1:
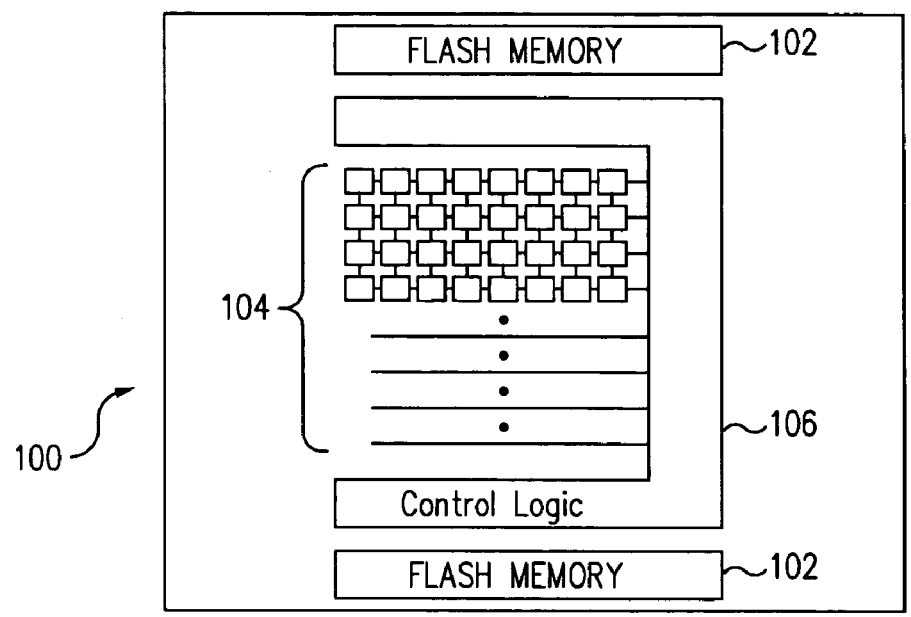
FIG. 1 shows a block diagram illustrating a programmable logic device in accordance with an embodiment of the present invention.

FIG. 1 shows a block diagram illustrating a programmable logic device (PLD) 100 in accordance with an embodiment of the present invention. PLD 100 includes flash memory (flash) 102 and SRAM memory (SRAM) 104. Flash 102 is non-volatile memory used to store configuration data, which can be transferred internally to SRAM 104, when desired via control logic 106, to configure PLD 100. SRAM 104 is the SRAM memory cells used to store configuration data that configures PLD 100 for its intended functionality.

It should be understood that flash 102 represents an exemplary type of non-volatile memory, but other types of non-volatile memory (e.g., EECMOS) that can be reprogrammed once or repeatedly may be substituted for flash 102. Furthermore, either flash 102 or SRAM 104 may be programmed (i.e., receive and store information in its memory) to store configuration data for PLD 100, but the device functionality of PLD 100 is determined by the information stored in SRAM 104. Thus, PLD 100 is configured or reconfigured (including partial reconfiguration) when information is programmed into SRAM 104.

Flash 102 and SRAM 104 within PLD 100 may be programmed by various techniques in accordance with an embodiment of the present invention. For example as described further herein, flash 102 and/or SRAM 104 may be programmed or reprogrammed via a first data port (e.g., such as a joint test action group (JTAG) port by employing standards such as either Institute of Electrical and Electronics Engineers (IEEE) 1149.1 or 1532 standards) and/or via a second data port (e.g., such as a central processing unit (CPU) port which is also referred to as a peripheral data port). One or more control pins and/or instructions (e.g., control bits) may be employed, for example, to determine which memory (flash 102 or SRAM 104) is to be programmed.

SRAM 104 may also be programmed via flash 102 under the direction of conventional control logic 106. By combining flash 102 and SRAM 104, a single integrated circuit (i.e., chip) solution is provided that offers numerous benefits. For example, SRAM 104 may be configured by flash 102 much faster than through external techniques by providing wide data transfer paths (e.g., including multiple blocks of data) between flash 102 and SRAM 104. Thus, PLD 100 may be configured very rapidly to provide essentially an "instant-on" capability (e.g., configuration data transferred from flash 106 to SRAM 104 in microseconds) due to the potentially rapid configuration process as compared to some conventional techniques (e.g., requiring a number of milliseconds to load an external bitstream into SRAM 104).

As another example, configuration data stored in flash 102 and/or SRAM 104 may be protected by security bits that configure circuitry to prevent unauthorized reading or copying of the configuration data (e.g., disable read back of the PLD pattern) from flash 102 or SRAM 104 to an external device. Furthermore, after programming flash 102 (e.g., in a secure environment such as in the manufacturing facility), no further external bitstream is required that could potentially be copied during system operation in the field by examining the external bitstream pattern upon power-up.

Figure 2:
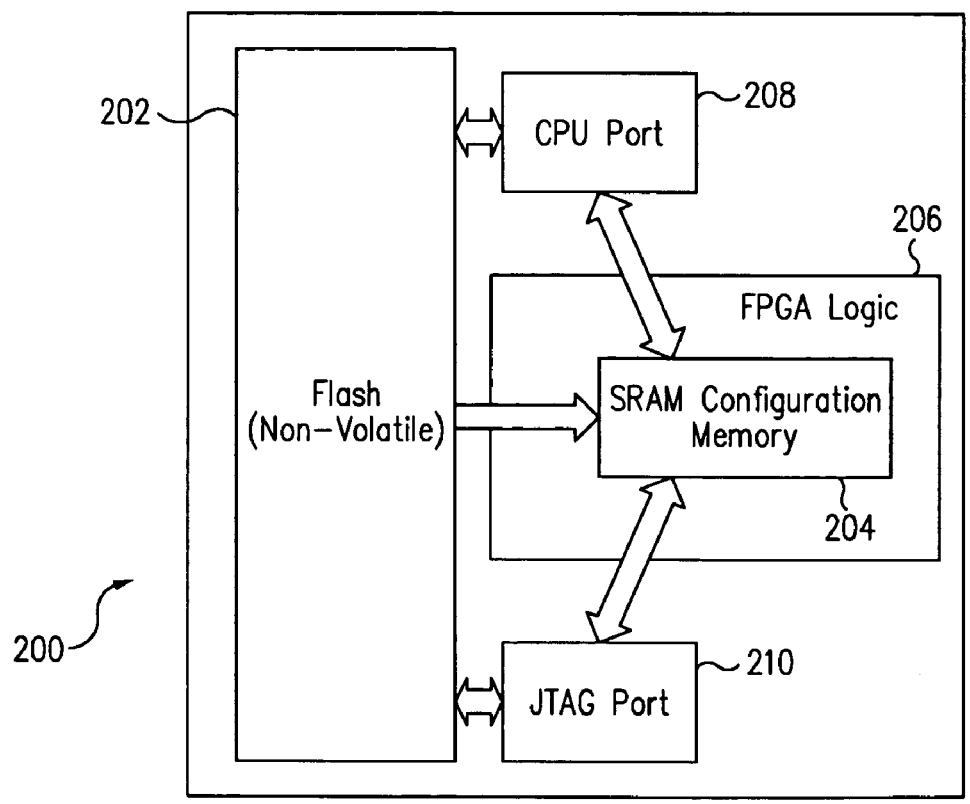
FIG. 2 shows a block diagram illustrating programming options of a programmable logic device in accordance with an embodiment of the present invention.

FIG. 2 shows a block diagram illustrating programming options of a programmable logic device (PLD) 200 in accordance with an embodiment of the present invention. PLD 200 includes flash memory (flash) 202, SRAM memory (SRAM) 204, logic 206, a data port 208, and a data port 210. As an example, PLD 200 may represent an exemplary implementation of PLD 100, with flash 202 and SRAM 204 corresponding to flash 102 and SRAM 104, respectively.

Data port 208 and data port 210 may, for example, represent a CPU port and a JTAG port, respectively. Logic 206 may represent core logic of PLD 200, such as FPGA-based logic circuits (e.g., lookup tables) or CPLD-based logic circuits (e.g., AND arrays), for example, with SRAM 204 storing configuration data which defines the functionality of logic 206.

As shown in FIG. 2, flash 202 and SRAM 204 may each be programmed via data port 208 and data port 210. For example, flash 202 may be programmed via data port 208 (e.g., CPU port) or data port 210 (e.g., JTAG port). Likewise, SRAM 204 (i.e., configuration memory for PLD 200) may be programmed via data port 208 (e.g., CPU port) or data port 210 (e.g., JTAG port) to configure PLD 200. Alternatively, SRAM 204 may be programmed via flash 202 to configure PLD 200.

In general, programming flash 202 may take longer (e.g., seconds) than programming SRAM 204 (e.g., milliseconds). However, once flash 202 is programmed, flash 202 can be employed to program SRAM 204 much faster (e.g., microseconds) than would generally be possible via data port-208 or data port 210 to provide essentially an instant-on capability (e.g., logic 206 may be available 200 microseconds after power-up). Flash 202 may also be programmed while PLD 200 is operating (e.g., background or transparent operation), with the information from flash 202 transferred to SRAM 204 when desired to reconfigure PLD 200.

Furthermore, PLD 200 may offer certain advantages over some conventional types of PLDs, such as a single chip solution which can provide high security (e.g., no external bitstream because flash 202 can maintain the configuration data for SRAM 204 when power is removed), reduced board area (e.g., no additional integrated circuits required to program PLD 200 due to the existence of flash 202), and/or improved reliability (e.g., PLD 200 may be self-contained such as for programming purposes or can accept configuration data either through data port 208 or data port 210).

By incorporating both non-volatile flash (e.g., flash 202) and volatile SRAM memory (e.g., SRAM 204) within a PLD to store configuration data, the flash memory eliminates the need for external configuration devices that are required for SRAM-based PLDs, while the SRAM allows for infinite reconfigurability that is generally not possible with non-volatile memory-based PLDs (e.g., flash or EECMOS memory). Furthermore, in accordance with an embodiment of the present invention, the flash memory may be upgraded (i.e., programmed) via two or more different ports (e.g., a JTAG port and a CPU port), in contrast to conventional non-volatile memory-based PLDs which allow programming only through a JTAG interface (e.g., EECMOS-based PLDs).

For example, by incorporating flash 202 and SRAM 204 into PLD 200 (e.g., an FPGA), PLD 200 provides an essentially instant-on, remotely upgradeable, non-volatile, and dynamically reconfigurable device (e.g., integrated circuit) with the ability to program flash 202 directly, for example, via a CPU interface or a JTAG interface. With flash 202 programmable via the CPU interface, certain benefits may be obtained. For example, system designers may upgrade their circuit boards (e.g., PLD 200 and possibly other devices on a circuit board) remotely via a simple software update provided to flash 202 via the CPU interface (e.g., update circuit board devices directly and remotely with software updates via the CPU interfaces of the devices, including PLD 200). Thus, this allows the system designers to leverage their traditional method of programming flash memory, which is via a CPU port interface.

Furthermore, by providing a CPU port, testing time may be reduced due to the faster throughput of a CPU port relative to a JTAG port. For example, Table 1 provides a general comparison between programming flash memory via a JTAG port and via a CPU port, as illustrated in Table 1. In general, utilizing the CPU port interface provides certain advantages in terms of data throughput and only disrupting the targeted device during programming, rather than all of the devices in the chain (e.g., as with a JTAG chain).

TABLE 1

| Parameters | JTAG | CPU | Comments |
|---|---|---|---|
| Programming method | Fixed pulse | Variable pulse | Variable pulse is also known as polling |
| Programming time | Slow | Fast | CPU mode employs polling, which is faster than JTAG method |
| Data speed | Slow | Approximately eight times faster than JTAG data speeds | JTAG writes data one bit at a time in contrast to eight bits at a time (CPU port) |
| System behavior | Affects every device in the JTAG chain | Only the target device sees the programming activity | CPU programming is more reliable, because it does not disturb the other devices |

Figure 3:
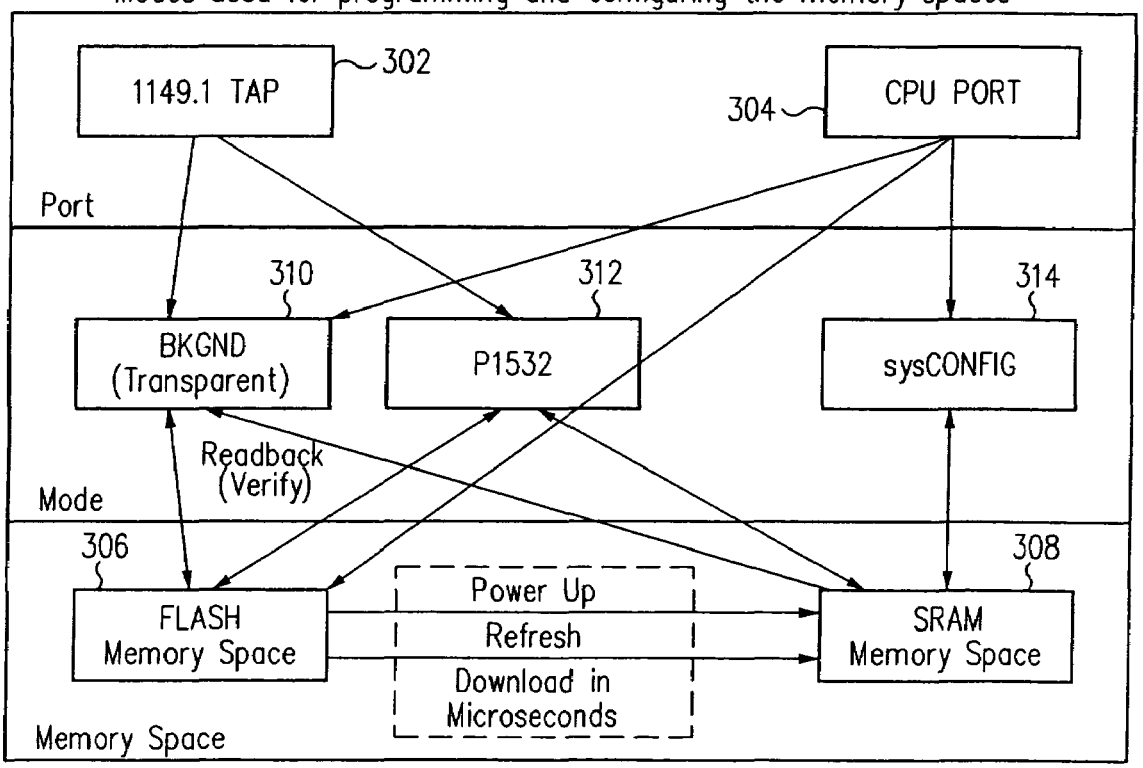
FIG. 3 shows a block diagram illustrating programming options of a programmable logic device in accordance with an embodiment of the present invention.

FIG. 3 shows a block diagram illustrating programming options of a programmable logic device in accordance with an embodiment of the present invention. For example, FIG. 3 may illustrate techniques for programming and/or configuring PLD 100 (FIG. 1) or PLD 200 (FIG. 2). As shown in FIG. 3, two ports are provided, a data port 302 and a data port 304, which are used to provide external data (i.e., information, which may include control signals, configuration data, security bits, or other types of data) to memory within the PLD.

Because various approaches or manufacturing flows may differ, multiple techniques or methods are provided to program and configure the memory space of the PLD exemplified in FIG. 3. The memory space or memory of the PLD includes flash 306 and SRAM 308, which can be configured or programmed as illustrated in FIG. 3.

For example, data port 302 (e.g. a JTAG port), which may for example represent an IEEE 1149.1 compliant test access port (TAP), may be used to program flash 306 or SRAM 308 and, thus allow in-system programmability or programming through a device-programmer system. The programming algorithm and circuitry may be designed to be fully IEEE 1532 compliant to allow programming via an IEEE 1532 programming mode 312, which allows for universal support from general automated test equipment (ATE) and other types of test systems.

Flash 306 may also be programmed in-system in a background mode (BKGND) 310 while the PLD continues to perform its system logic functions that are controlled or configured by SRAM 308 (i.e., programming of flash 306 is transparent to the device's logic operations). Control pins and/or instructions (e.g., control bits), for example, may be employed to determine which memory (flash 306 or SRAM 308) will be used to store the externally-provided data (e.g., via data port 302 or via data port 304) and which mode will be utilized (e.g., background mode 310 or 1532 programming mode 312).

Flash 306 and SRAM 308 may also be programmed via data port 304. Data port 304 may, for example, represent a dedicated serial interface and/or a CPU port (e.g., a 33 MHz, 8-bit parallel port) utilized by an external microprocessor for transferring data to flash 306 or SRAM 308. When utilizing data port 304 to configure SRAM 308, the PLD is in a system configuration mode 314 (sysCONFIG), with the data stored in SRAM 308 determining the logic and functionality provided by the PLD. When utilizing data port 304 to configure flash 306, flash 306 may be programmed directly or through background mode 310. For example, a field upgrade may be downloaded to reprogram flash 306 via data port 304 (e.g., CPU interface) while the PLD is operating. Flash 306 may then be utilized to reconfigure SRAM 308 (e.g., in less than a millisecond).

As illustrated in FIG. 3, there are three different ways to configure SRAM 308: 1) downloading data from flash 306, 2) IEEE 1532 programming mode 312 via data port 302, and 3) system configuration mode 314 via data port 304. The fastest method for configuring SRAM 308 would generally occur by employing flash 306 to download data to SRAM 308, which may occur, for example, in microseconds as compared to milliseconds or longer for the other methods. As an example, flash 306 may download data directly to SRAM 308 automatically at power-up as well as on command by a user.

Flash 306 is bypassed when SRAM 308 is configured via data port 304 by employing system configuration mode 314 or configured via data port 302 by employing IEEE 1532 programming mode 312 (e.g., via IEEE 1149.1 TAP of data port 302). System configuration mode 314 may, for example, be available at power-up and upon user command to configure SRAM 308, with the PLD's input/output (I/O) circuits tri-stated during configuration of SRAM 308 (i.e., loading data into memory cells of SRAM 308).

In general, the PLD's I/O circuits may be tri-stated during configuration of SRAM 308. However in a conventional manner, when reading back the configuration data using system configuration mode 314, the I/O circuits and logic of the PLD may continue to operate to perform their intended functions. When configuring SRAM 308 using IEEE 1532 programming mode 312, the boundary-scan register controls the I/O circuits. Furthermore, after flash 306 or SRAM 308 is programmed, a standard verify cycle may be performed, for example by background mode 310 or IEEE 1532 programming mode 312, to read back the data stored in the memory (i.e., flash 306 or SRAM 308) to ensure or verify that the PLD has been properly loaded with the data (e.g., configuration data or data pattern).

As an example, Table 2 summarizes various exemplary programming or configuration modes of operation in accordance with an embodiment illustrated in FIG. 3. The exemplary modes of operation are provided with exemplary time estimates to perform the corresponding operation.

TABLE 2

Exemplary Modes of Operation

| OPERATION | DURING POWER-UP IN-SYSTEM | ON COMMAND IN-SYSTEM | OFFLINE (PROGRAMMER) |
|---|---|---|---|
| Auto-configure SRAM from on-chip flash memory | Yes (e.g., in microseconds) | | |
| Reconfigure SRAM from on-chip flash memory | | Yes (e.g., in microseconds) | |
| Program on-chip flash memory while PLD is operating | | Yes (e.g., in seconds) | |
| Program on-chip flash memory | | Yes (e.g., in seconds) | Yes (e.g., in seconds) |
| Configure SRAM directly in system configuration mode | Yes (e.g., in milliseconds) | Yes (e.g., in milliseconds) | |

Non-volatile and infinitely reconfigurable programmable logic devices are disclosed herein in accordance with one or more embodiments of the present invention. For example, programmable logic devices, such as for example high density FPGAs or CPLDs which utilize one or more aspects of the present invention, may be in-system programmable, remotely upgradeable, dynamically reconfigurable, and/or have instant-on capability.

Figure 4:
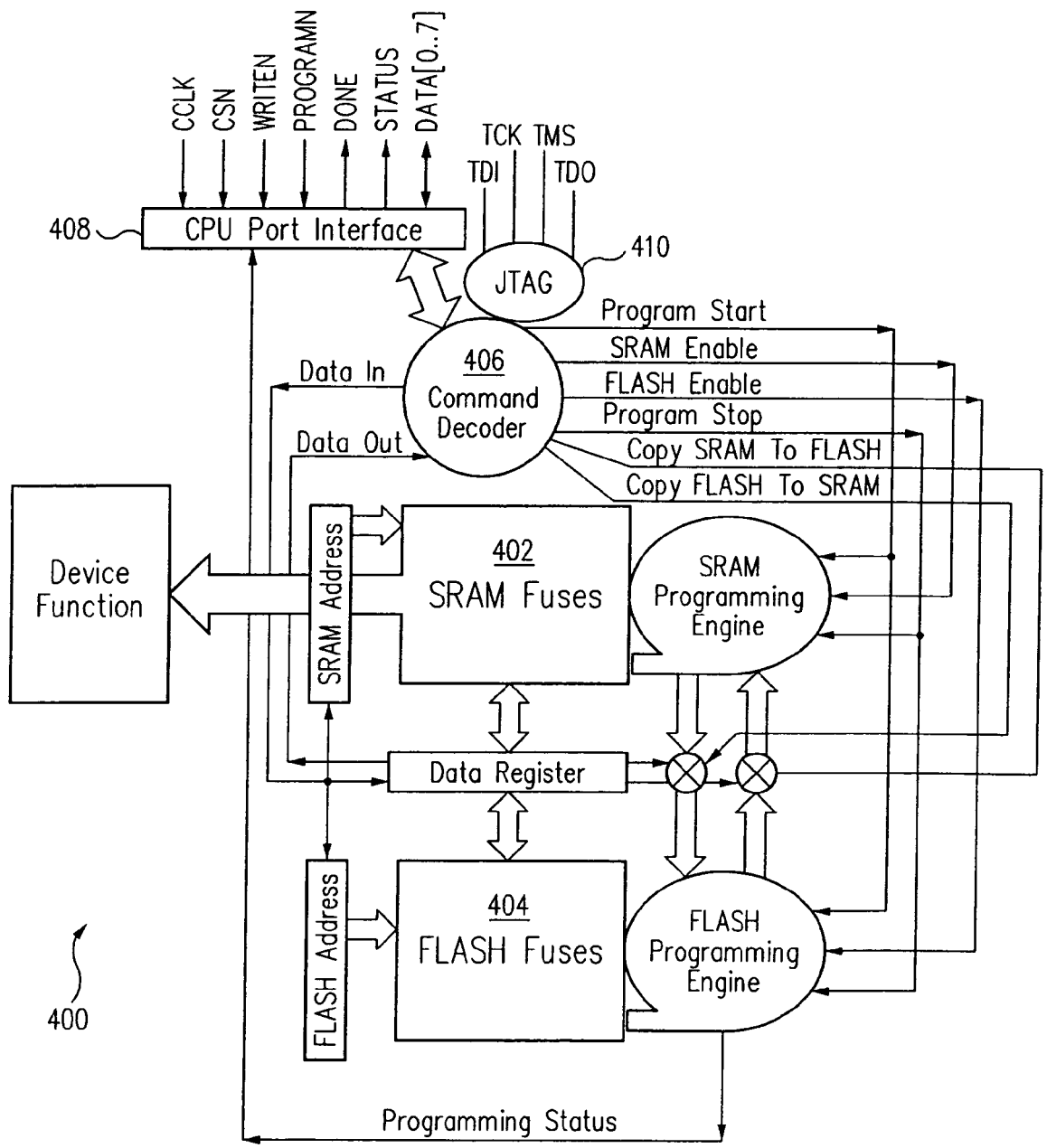
FIG. 4 shows a block diagram illustrating exemplary programming activities of a programmable logic device in accordance with an embodiment of the present invention.

FIG. 4 shows a block diagram illustrating exemplary programming activities of a programmable logic device (PLD) 400 in accordance with an embodiment of the present invention. PLD 400 may represent PLD 100 (FIG. 1) or PLD 200 (FIG. 2) and illustrate in an exemplary fashion various activities within PLD 400 having SRAM memory 402 (labeled SRAM fuses) and flash memory 404 (labeled flash fuses), with information stored in SRAM memory 402 determining the device function or functionality of PLD 400.

PLD 400 includes a CPU port interface 408 and a JTAG port interface 410, with a command decoder 406 controlling data flow and commands within PLD 400 and to/from CPU port interface 408 and JTAG port interface 410. For example, command decoder 406 controls the flow of data between SRAM memory 402 and flash memory 404 and CPU port interface 408 and JTAG port interface 410. As illustrated, data may be transferred from SRAM memory 402 to flash memory 404 or from flash memory 404 to SRAM memory 402.

Table 3 illustrates various exemplary programming actions for PLD 400 (or PLD 100 of FIG. 1 or PLD 200 of FIG. 2). The cross port programming options illustrates that not only can data may be transferred internally between SRAM memory 402 and flash memory 404, but externally also via CPU port interface 408 (labeled Action on CPU port) and JTAG port interface 410 (labeled Action on JTAG port). For example, information stored in SRAM memory 402 may be readback via CPU port interface 408 and the information or a modified form of the information may be utilized to program flash memory 404 via JTAG port interface 410.

TABLE 3

| Program Options | Action On CPU Port | | Action On JTAG Port | |
|---|---|---|---|---|
| | SRAM Fuses | FLASH Fuses | SRAM Fuses | FLASH Fuses |
| CPU Port Only | Program Being Read | No Action | No Action | No Action |
| | Copy From SRAM | Copy From SRAM | No Action | No Action |
| | Copy From FLASH | Being Read | No Action | No Action |
| | Device in operation | Program | No Action | No Action |
| | Device not in operation | Program | No Action | No Action |
| JTAG Port Only | No Action | No Action | Program Being Read | No Action |
| | No Action | No Action | Being Read | Copy From SRAM |
| | No Action | No Action | Copy From FLASH | Being Read |
| | No Action | No Action | Device in operation | Program |
| | No Action | No Action | Device not in operation | Program |
| Cross Port | Program | No Action | No Action | Readback |
| | No Action | Program | Readback | No Action |
| | Readback | No Action | No Action | Program |
| | No Action | Readback | Program | No Action |
| Both Ports In Parallel | Program | No Action | No Action | Program |
| | No Action | Program | Program | No Action |

Table 4 illustrates an exemplary comparison between JTAG port programming and CPU port programming of flash memory (e.g., flash fuses of PLD 400). In general, programming via the JTAG port offers certain advantages over programming via the CPU port, as summarized in Table 4.

TABLE 4

| Parameters | On CPU Port | On JTAG Port |
|---|---|---|
| Time | Fast Data Is Provided in parallel, 8 bits at a time | Slow Data is provided in serial, 1 bit at a time. |
| Interface | Direct High CCLK data clocking rate, 66–130 MHZ | Debug Slower TCK data clocking rate, ~25 MHZ |
| Intelligent Programming | Yes, the Status pin is checked directly | No, the status pin can't be checked |

A non-volatile, infinitely reconfigurable PLD, in accordance with one or more embodiments of the present invention, may reliably provide designers with many desirable benefits, such as for example logic availability within microseconds of power-up or reprogramming and with high security. Significant savings may accrue in the amount of board space, system design effort, inventory costs, handling costs, and manufacturing costs that are required. Field system upgrades, including those performed during system operation, may be simplified.

In accordance with one or more embodiments, a flexible combination of programming/configuration modes permits a system designer to achieve numerous benefits. For example, programming may be performed in the manufacturing facility to allow the PLD to auto-configure during power-up (e.g., within microseconds). The PLD may be reconfigured periodically during operation. As an example, a field upgrade may be downloaded to reprogram flash memory while the PLD is operating, with the data then used to reconfigure its SRAM in microseconds. Alternatively, a default pattern may be programmed into the flash memory during manufacturing, but a new pattern may be programmed directly into the SRAM or the flash memory via one or more data ports (e.g., a JTAG or CPU port), depending on system conditions or a desired application. Furthermore, a pattern may be programmed into the flash memory to verify system power-up and to checkout a configuration in manufacturing and then the PLD may be reconfigured to a system-operation pattern in-system via one of the data ports.

Security of the PLD configuration pattern is enhanced because an external bitstream is not required during configuration. Non-volatile security bits may also be employed to prevent or disable read back of the PLD pattern. Furthermore, system design may be simplified because there is no noise, reliability, or board space concerns related to configuration from an external source, such as for example a series programmable read only memory (SPROM).

In accordance with one or more embodiments of the present invention, a PLD (e.g., an FPGA) is disclosed providing certain advantages, such as in-system programmability, remote upgradeability (e.g., via a CPU mode interface), essentially instant-on capability, infinite reconfigurability, and dynamic reconfigurability. For example, non-volatile flash memory is incorporated along with SRAM memory within an FPGA, with the flash memory and the SRAM memory programmable via a JTAG interface and a CPU interface. The PLD provides essentially instant-on capability (e.g., less than 0.001 second) by transferring configuration data from the flash memory to the SRAM memory upon power-up of the PLD (rather than configuring the PLD via an external bitstream, which generally takes much longer to complete).

Embodiments described above illustrate but do not limit the invention. It should also be understood that numerous modifications and variations are possible in accordance with the principles of the present invention. Accordingly, the scope of the invention is defined only by the following claims.

We claim:

1. A programmable logic device comprising:
   volatile memory adapted to configure the programmable logic device for its intended function based on configuration data stored by the volatile memory;
   non-volatile memory adapted to store data which is transferable to the volatile memory to configure the programmable logic device;
   a first data port adapted to receive external data for transfer into the volatile memory and for transfer into the non-volatile memory; and
   a second data port adapted to receive external data for transfer into the volatile memory and for transfer into the non-volatile memory.

2. The programmable logic device of claim 1, further comprising control logic adapted to transfer the data from the non-volatile memory to the volatile memory to configure the programmable logic device.

3. The programmable logic device of claim 1, further comprising core logic adapted to be configured by the configuration data stored in the volatile memory.

4. The programmable logic device of claim 1, wherein the volatile memory comprises static random access memory and the non-volatile memory comprises flash memory.

5. The programmable logic device of claim 1, wherein the non-volatile memory is further adapted to store security bits that can be set to prevent unauthorized reading of the data from the programmable logic device.

6. The programmable logic device of claim 1, wherein the first data port is a JTAG port and the second data port is a CPU port.

7. The programmable logic device of claim 6, wherein the first data port supports an IEEE 1149.1 standard, with the external data transferred to the non-volatile memory and/or the volatile memory via an IEEE 1532 programming mode or to the non-volatile memory via a background programming mode.

8. The programmable logic device of claim 6, wherein the external data is transferred through the second data port to the volatile memory via a system configuration mode, to the non-volatile memory directly, and/or to the non-volatile memory via a background programming mode.

9. The programmable logic device of claim 1, wherein the programmable logic device further supports reading back of the configuration data stored in the volatile memory and/or the data stored in the non-volatile memory for verification.

10. The programmable logic device of claim 9, wherein the programmable logic device further supports the reading back while the programmable logic device performs its intended function based on the configuration data stored by the volatile memory.

11. The programmable logic device of claim 1, wherein the programmable logic device supports transfer of the external data to the non-volatile memory while the programmable logic device is operable to perform its intended logic functions.

12. A programmable device comprising:
    static random access memory adapted to configure the programmable device for its intended function based on configuration data stored by the static random access memory;
    flash memory adapted to store data which is transferable to the static random access memory to configure the programmable device;
    a JTAG port adapted to receive external data for transfer into the static random access memory and for transfer into the flash memory;
    a CPU port adapted to receive external data for transfer into the static random access memory and for transfer into the flash memory; and
    means for transferring the external data received by the JTAG port or the CPU port to the static random access memory or the flash memory.

13. The programmable device of claim 12, wherein the means comprises:
    a background mode adapted to transfer the external data from the JTAG port to the flash memory or transfer the external data from the CPU port to the flash memory;
    a programming mode adapted to transfer the external data from the JTAG port to the flash memory and/or to the static random access memory; and
    a system configuration mode adapted to transfer the external data from the CPU port to the static random access memory.

14. The programmable device of claim 13, wherein the background mode and the programming mode are further adapted to support readback of data stored in the flash memory and the static random access memory.

15. The programmable device of claim 13, wherein the JTAG port supports an IEEE 1149.1 standard and the programming mode supports an IEEE 1532 standard.

16. The programmable device of claim 12, further comprising control logic adapted to transfer the data from the flash memory to the static random access memory to configure the programmable device.

17. The programmable device of claim 12, further comprising core logic adapted to be configured by the data stored in the static random access memory.

18. A method of providing programming options for a programmable device, the method comprising:
providing a background mode for transferring external data via a first data port or a second data port to non-volatile memory;
providing a direct mode for transferring the external data via the second data port to the non-volatile memory; and
providing a system configuration mode for transferring the external data via the second data port to volatile memory, wherein the volatile memory is adapted to configure the programmable device.

19. The method of claim 18, wherein the background mode is further adapted to readback the external data stored in the non-volatile memory and the volatile memory.

20. The method of claim 18, wherein the first data port is adapted to support a JTAG standard and the second data port is adapted to provide a CPU interface.

21. The method of claim 18, further comprising providing a programming mode for transferring the external data via the first data port to the non-volatile memory or to the volatile memory.

22. The method of claim 21, wherein the programming mode is further adapted to readback the external data stored in the non-volatile memory and the volatile memory.

23. The method of claim 21, wherein the programming mode is further adapted to support an IEEE 1532 standard.

24. The method of claim 18, further comprising providing a transfer mode for transferring the external data stored in the non-volatile memory to the volatile memory.

25. A programmable logic device comprising:
volatile memory adapted to configure the programmable logic device for its intended function based on configuration data stored by the volatile memory;
non-volatile memory adapted to store data which is transferable to the volatile memory to configure the programmable logic device; and
a CPU port adapted to receive external data for transfer into the volatile memory and for transfer into the non-volatile memory.

26. The programmable logic device of claim 25, wherein the volatile memory comprises static random access memory and the non-volatile memory comprises flash memory.

27. The programmable logic device of claim 25, wherein the programmable logic device supports transfer of the external data through the CPU port to the non-volatile memory while the programmable logic device is operable to perform its intended logic functions.

28. The programmable logic device of claim 25, further comprising a JTAG port adapted to receive external data for transfer into either the volatile memory or the non-volatile memory.

29. The programmable logic device of claim 28, wherein the data stored in the volatile memory is transferable directly to the non-volatile memory.

30. The programmable logic device of claim 28, wherein the data stored in either the volatile memory or the non-volatile memory is transferable out of the programmable logic device via the CPU port or the JTAG port and transferable into the non-volatile memory or the volatile memory via the JTAG port or the CPU port, respectively, to complete a cross port transfer of the data.

31. A method of providing data transfer options for a programmable logic device, the method comprising:
providing a CPU port adapted to receive external data for transfer into volatile memory and for transfer into non-volatile memory of the programmable logic device, wherein data stored in the volatile memory configures the programmable logic device; and
providing data registers adapted to transfer data stored in the non-volatile memory to the volatile memory and to transfer data stored in the volatile memory to the non-volatile memory.

32. The method of claim 31, wherein the volatile memory comprises static random access memory and the non-volatile memory comprises flash memory.

33. The method of claim 31, further comprising providing a JTAG port adapted to receive the external data for transfer into either the volatile memory or the non-volatile memory of the programmable logic device.

34. The method of claim 33, wherein the CPU port and the JTAG port provide cross port data transfer capability between the volatile memory and the non-volatile memory.

35. The method of claim 31, wherein the programmable logic device supports transfer of the external data through the CPU port to the non-volatile memory while the programmable logic device is operable to perform its intended logic functions.

* * * * *